United States Patent
Li et al.

(10) Patent No.: US 10,347,694 B2
(45) Date of Patent: Jul. 9, 2019

(54) PIXEL ARRANGEMENT MODE SHARING BLUE LIGHT LIGHT EMITTING LAYER AND ORGANIC ELECTROLUMINESCENT DEVICE

(71) Applicants: KunShan New Flat Panel Display Technology Center Co., Ltd., KunShan (CN); Beijing Visionox Technology Co., Ltd., Shangdi (CN)

(72) Inventors: Weiwei Li, KunShan (CN); Song Liu, Shangdi (CN); Xiuqi Huang, KunShan (CN); Zhizhong Luo, KunShan (CN)

(73) Assignees: KunShan New Hat Panel Display Technology Center Co., Ltd., KunShan (CN); Beijing Visionox Technology Co., Ltd., ChangDi (CN)

(*) Notice: Subject to any disclaimer, the term of this patent is extended or adjusted under 35 U.S.C. 154(b) by 0 days.

(21) Appl. No.: 15/562,775

(22) PCT Filed: Mar. 16, 2016

(86) PCT No.: PCT/CN2016/076463
§ 371 (c)(1),
(2) Date: Sep. 28, 2017

(87) PCT Pub. No.: WO2016/155500
PCT Pub. Date: Oct. 6, 2016

(65) Prior Publication Data
US 2018/0286929 A1    Oct. 4, 2018

(30) Foreign Application Priority Data
Mar. 30, 2015   (CN) .......................... 2015 1 0145077

(51) Int. Cl.
*H01L 27/32* (2006.01)
*H01L 51/56* (2006.01)
(Continued)

(52) U.S. Cl.
CPC ........ *H01L 27/3218* (2013.01); *H01L 27/322* (2013.01); *H01L 27/3213* (2013.01);
(Continued)

(58) Field of Classification Search
CPC ............. H01L 27/3218; H01L 27/3213; H01L 27/322; H01L 51/001; H01L 51/504; H01L 51/56; H01L 51/5056
(Continued)

(56) References Cited

U.S. PATENT DOCUMENTS

2009/0091238 A1    4/2009   Cok
2010/0128202 A1    5/2010   Chu Ke et al.
(Continued)

FOREIGN PATENT DOCUMENTS

CN    102184937 A    9/2011
CN    103872091 A    6/2014
(Continued)

OTHER PUBLICATIONS

Office Action of Japan Application No. 2017-551652.
(Continued)

*Primary Examiner* — Long K Tran

(57) ABSTRACT

Disclosed is a pixel arrangement with a shared blue light emitting layer (7), comprising m rows and n columns of first pixel units, the first pixel units are blue light sub-pixels (B), m is a non-zero natural number, n is a natural number larger than or equal to 2, wherein, two columns of second pixel units are arranged between neighboring first pixel units, each of the second pixel units comprises a red light sub-pixel (R), a green light sub-pixel (G) and a yellow light sub-pixel (Y) that are arranged in a juxtaposed manner. By properly modifying the pixel arrangement of the device configuration, light emitting in four colors can be achieved by using only two or less sets of low precision masks in the prepa-
(Continued)

ration process, so that the resolution is increased with reduced cost, and as compared to conventional pixel arrangement, the PPI can be doubled, reaching 600 PPI.

16 Claims, 4 Drawing Sheets

(51) Int. Cl.
H01L 51/00 (2006.01)
H01L 51/50 (2006.01)
H01L 51/52 (2006.01)

(52) U.S. Cl.
CPC .......... *H01L 51/001* (2013.01); *H01L 51/504* (2013.01); *H01L 51/5044* (2013.01); *H01L 51/5056* (2013.01); *H01L 51/5072* (2013.01); *H01L 51/5088* (2013.01); *H01L 51/5092* (2013.01); *H01L 51/5265* (2013.01); *H01L 51/56* (2013.01); H01L 51/006 (2013.01); H01L 51/0052 (2013.01); H01L 51/0058 (2013.01); H01L 51/0059 (2013.01); H01L 51/0067 (2013.01); H01L 51/0072 (2013.01); H01L 51/0081 (2013.01); H01L 51/0085 (2013.01); H01L 51/5096 (2013.01); H01L 2251/558 (2013.01)

(58) Field of Classification Search
USPC .......................................................... 257/40
See application file for complete search history.

(56) References Cited

U.S. PATENT DOCUMENTS

| 2010/0231484 | A1 | 9/2010 | Cok et al. |
| 2012/0112172 | A1 | 5/2012 | Kashiwabara |
| 2012/0242218 | A1 | 9/2012 | Yoshinaga et al. |
| 2013/0234121 | A1 | 9/2013 | Sonoyama |
| 2014/0042459 | A1* | 2/2014 | Richieri ................ H01L 29/872 257/77 |
| 2014/0246654 | A1 | 9/2014 | Huang et al. |
| 2015/0036081 | A1* | 2/2015 | Beon ................ G02F 1/133528 349/96 |
| 2015/0138463 | A1 | 5/2015 | Jinta et al. |
| 2015/0364526 | A1 | 12/2015 | Peng et al. |

FOREIGN PATENT DOCUMENTS

| CN | 104254931 A | 12/2014 |
| CN | 104766875 A | 7/2015 |
| KR | 10-2010-0087707 A | 8/2010 |
| KR | 10-2012-0109301 A | 10/2012 |
| KR | 20140124095 A | 10/2014 |
| WO | 2014020817 A | 6/2014 |

OTHER PUBLICATIONS

Taiwan 1st Office Action—Identifying document No. 105109455.
Chinese Decision of Rejection—CN Application No. 2015101450772.
Taiwan Decision of Rejection—Identifying document No. 105109455.
OLED Display Base and Industrialization (related part of p. 134 and 135)—as appendix of Chinese Decision of Rejection—CN Application No. 2015101450772.
International preliminary report on patentability—Application PCT/CN2016/076463.
Written Opinion of International Search Authority—Application PCT/CN2016/076463.
Chinese first office action—CN Application No. 2015101450772.
Chinese second office action—CN Application No. 2015101450772.
First Office Action of KR Application No. 10-2017-7030581.
Extended European Search Report of EP Application No. 16771255.3.

* cited by examiner

PIXEL ARRANGEMENT MODE SHARING BLUE LIGHT LIGHT EMITTING LAYER AND ORGANIC ELECTROLUMINESCENT DEVICE

TECHNICAL FIELD

The present invention relates to the technical field of organic electroluminescent devices, and in particular relates to a pixel arrangement with a shared blue light emitting layer and an organic electroluminescent device having the pixel arrangement.

BACKGROUND

An organic electroluminescent display device (OLED) usually includes a plurality of pixels, and each pixel is composed of several light emitting areas. Currently, one widely used solution in small and medium sized devices is forming a pixel with three sub-pixels of red, green and blue. In order to obtain high pixel resolution, the three types of light emitting areas of red, green and blue need to be evaporation coated respectively by using high precision masks, and therefore three sets of precision metal masks are needed. But the highest precision of a precision metal mask is limited by processing levels, which causes that the resolution of organic electroluminescent display devices is difficult to increase. In another aspect, because the precision mask has a high precision and every light emitting area needs aligning and adjustment, while each time of adjustment causes the finished product ratio of display devices to decrease, the device cost is increased and the realization of higher resolution is limited.

A relatively better solution of device configuration in the art is using a shared blue light emitting layer, as shown in FIG. 1, the light emitting layer of an OLED device includes three types of light emitting areas of red, green and blue, wherein the red light emitting area 16 and the green light emitting area 15 is arranged in a juxtaposed manner on a hole transport layer, a part of the blue light emitting layer 7 is arranged on the hole transport layer, and other parts of the blue light emitting layer 7 covers the red light emitting area 16 and the green light emitting area 15. During preparation, two sets of precision masks are respectively used to form the red light emitting area 16 and the green light emitting area 15, and then an ordinary open mask is used for evaporation coating of the blue light emitting layer 7. This solution requires three times of evaporation coating (i.e. changing the mask for 3 times), and the masks used for prepare the red and green light emitting areas need to be precision masks. Although one less set of precision mask is used in this solution, it still needs to use two sets of precision masks for two sets of single-colored sub-pixels, and it still needs three times of aligning, which reduces the resolution of the display device.

Currently, the best mode of pixel arrangement in the art is the IGNIS mode, wherein each pixel is composed of red, green and blue (RGB) sub-pixels arranged in a triangular shape, as shown in FIG. 3. This pixel arrangement mode notably increases the resolution, but still cannot reach a resolution higher than 400 pixels per inch (PPI).

SUMMARY OF THE INVENTION

In consideration of this, the present invention is intended to solve the technical problem that the pixel arrangement mode in prior art cannot reach a high PPI resolution and its device preparation process still needs to use high precision masks and the production process is complicated, by providing a pixel arrangement with a shared blue light emitting layer and an organic electroluminescent device having such pixel arrangement that properly modifies the device configuration arrangement so that light emitting in four colors can be achieved by using only two or less sets of low precision masks in the preparation process, thereby increasing the resolution and reducing the cost.

Another aspect of the present invention is to provide a preparation method of an organic electroluminescent device with a shared blue light emitting layer.

In order to solve the above-mentioned technical problem, the present invention adopts the following technical scheme:

A pixel arrangement with a shared blue light emitting layer, comprising m rows and n columns of first pixel units, the first pixel units are blue light sub-pixels, m is a non-zero natural number, n is a natural number larger than or equal to 2, wherein, two columns of second pixel units are arranged between neighboring first pixel units, each of the second pixel units comprises a red light sub-pixel, a green light sub-pixel and a yellow light sub-pixel that are arranged in a juxtaposed manner.

The red light sub-pixel, the green light sub-pixel and the yellow light sub-pixel in the second pixel unit have completely or partially overlapping projections in a row direction.

The red light sub-pixel, the green light sub-pixel and the yellow light sub-pixel in the second pixel unit have no overlapping projection on the blue light sub-pixel.

Every two neighboring rows of the second pixel units are arranged to mirror each other.

An organic electroluminescent device having the above-mentioned pixel arrangement with a shared blue light emitting layer comprises a substrate, with a first electrode layer, a plurality of light emitting unit layers and a second electrode layer formed in sequence on the substrate, wherein the light emitting unit layers comprise a hole injection layer, a hole transport layer, a light emitting layer, an electron transport layer and an electron injection layer arranged in sequence upon the first electrode layer, wherein, the light emitting layer comprises a blue light emitting layer and a yellow light emitting layer that are stacked with a blocking layer interposed between them; the blue light emitting layer is in physical contact with the hole transport layer or with the electron transport layer, a projection of the yellow light emitting layer on the substrate is within a projection area of the blue light emitting layer on the substrate and partially covers the projection area of the blue light emitting layer; the organic electroluminescent device further comprises an optical compensation layer arranged next to the hole injection layer, a projection of the optical compensation layer on the substrate is within the projection area of the yellow light emitting layer on the substrate and partially covers the projection area of the yellow light emitting layer; the optical compensation layer comprises a yellow light optical compensation layer and a red light optical compensation layer that are arranged side by side, and the yellow light optical compensation layer has a thickness less than that of the red light optical compensation layer.

The blue light emitting layer covers the hole transport layer, the blocking layer covers part of the blue light emitting layer, the yellow light emitting layer covers the blocking layer, and the blocking layer is an electron blocking layer.

The host material of the blue light emitting layer is a hole type host material. Herein, the hole type host material means that the hole transport capability of the shared blue light emitting layer is stronger than its electron transport capability, namely, its hole migration rate is larger than its electron migration rate. Such a host material is for example NPB or TCTA. Herein, a hole transport material may be used as the host material of the shared blue light emitting layer.

The yellow light emitting layer covers part of the hole transport layer, the blocking layer covers the yellow light emitting layer, part of the blue light emitting layer covers the blocking layer, and the blocking layer is a hole blocking layer.

The host material of the blue light emitting layer is an electron type host material. Herein, the electron type host material means that the electron transport capability of the shared blue light emitting layer is stronger than its hole transport capability, namely, its electron migration rate is larger than its hole migration rate. Herein, an electron transport material may be used as the host material of the shared blue light emitting layer.

The host material of the blue light emitting layer has a structure of the following structural formula (1) or structural formula (2):

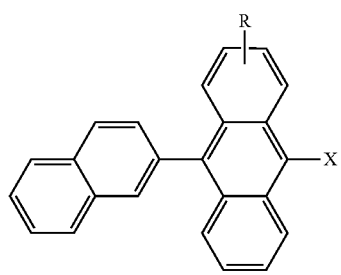

formula (1)

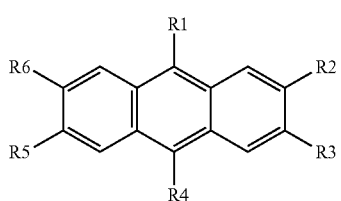

formula (2)

wherein, in formula (1), R is selected from H and substituents of $C_1$-$C_{20}$ phenyl derivatives, $C_1$-$C_{20}$ naphthyl derivatives or $C_1$-$C_{20}$ aryl derivatives; X is selected from monomers of naphthyl derivatives, phenyl derivatives, phenyl naphthyl derivatives, phenyl anthryl derivatives; in formula (2), R1-R6 are identical or different, and are individually selected from H, halogen atom, hydroxyl group, cyano group, nitryl group, a group having carbonyl with no more than 20 carbon atoms, a group having carbonyl ester part, alkyl group, alkenyl group, alkoxyl group, a group having silyl with no more than 30 carbon atoms, a group having aryl, a group having heterocyclic part, a group having amino, or derivatives of the above.

The host material of the blue light emitting layer is anthracene-di-naphthyl, anthracene-di-biphenyl, anthracene-naphthyl-biphenyl, anthracene-di-phenyl, or a mixture of several of the above.

The host material of the blue light emitting layer is a compound having a structure selected from the following structural formulas (3) to (11):

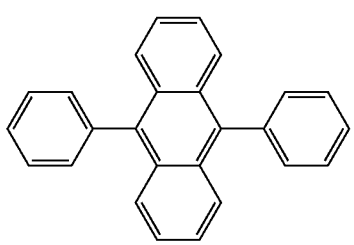

formula (3)

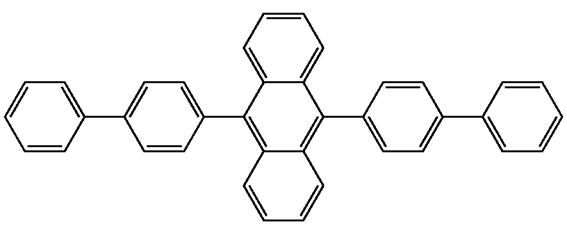

formula (4)

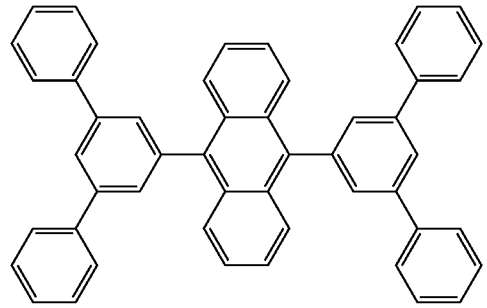

formula (5)

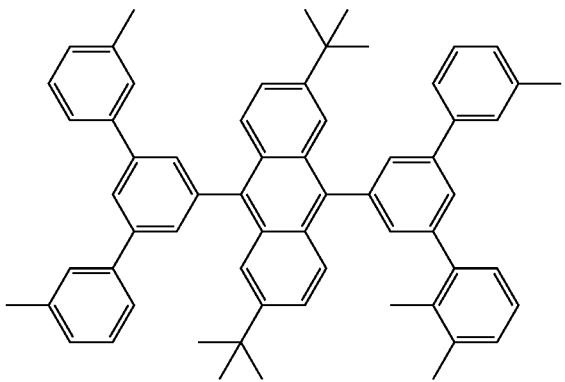

formula (6)

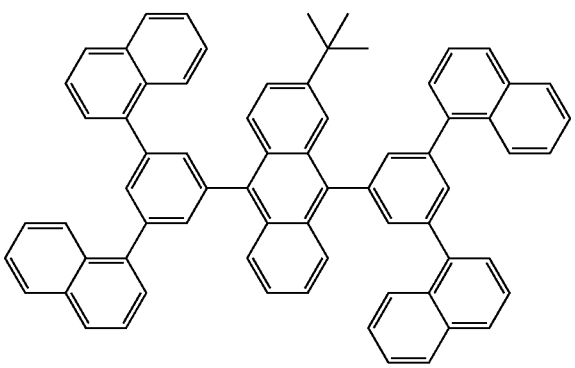

formula (7)

-continued

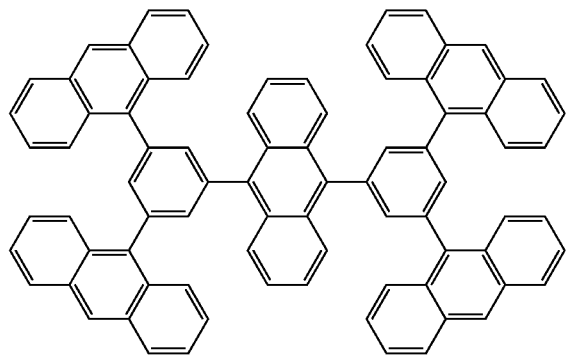

formula (8)

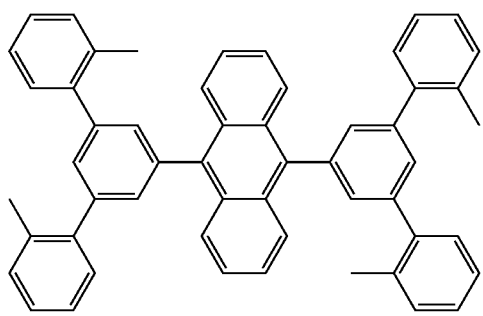

formula (9)

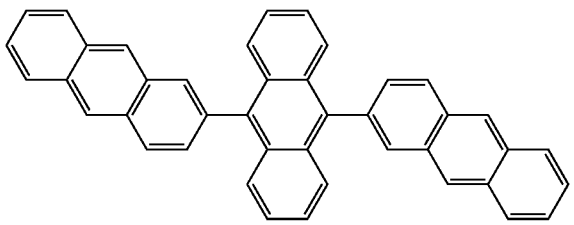

formula (10)

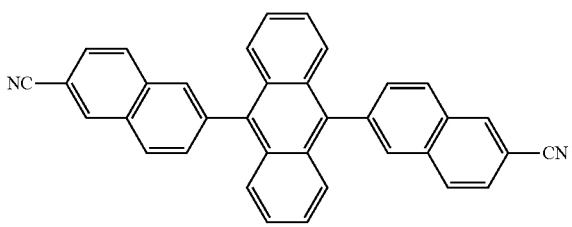

formula (11)

The optical compensation layer is interposed between the first electrode layer and the hole injection layer, the optical compensation layer covers part of the first electrode layer and has a projection on the substrate within a projection area of the yellow light emitting layer on the substrate.

The first electrode layer comprises a first conducting layer and a second conducting layer that are stacked, and the optical compensation layer is made of the same material as the second conducting layer.

The optical compensation layer is interposed between the hole injection layer and the hole transport layer, the optical compensation layer covers part of the hole injection layer and has a projection on the substrate within a projection area of the yellow light emitting layer on the substrate.

The optical compensation layer is made of the same material as the hole injection layer.

The blue light emitting layer and the blocking layer has a total thickness of 20-50 nm, the yellow light optical compensation layer has a thickness of 10-30 nm, and the red light optical compensation layer has a thickness of 30-60 nm.

An organic electroluminescent device having the above-mentioned pixel arrangement with a shared blue light emitting layer comprises a substrate, with a first electrode layer, a plurality of light emitting unit layers and a second electrode layer formed in sequence on the substrate, wherein the light emitting unit layers comprise a hole injection layer, a hole transport layer, a light emitting layer, an electron transport layer and an electron injection layer arranged in sequence upon the first electrode layer, wherein, the light emitting layer comprises a blue light emitting layer and a yellow light emitting layer that are stacked with a blocking layer interposed between them; the blue light emitting layer is in physical contact with the hole transport layer or with the electron transport layer, a projection of the yellow light emitting layer on the substrate is within a projection area of the blue light emitting layer on the substrate and partially covers the projection area of the blue light emitting layer; the organic electroluminescent device further comprises a colored optical filter layer arranged beneath the first electrode layer, a projection of the colored optical filter layer on the substrate overlaps the projection area of the yellow light emitting layer on the substrate, and the colored optical filter layer comprises a red light optical filter, a green light optical filter and a yellow light optical filter.

The blue light emitting layer covers the hole transport layer, the blocking layer covers part of the blue light emitting layer, the yellow light emitting layer covers the blocking layer, and the blocking layer is an electron blocking layer.

The yellow light emitting layer covers part of the hole transport layer, the blocking layer covers the yellow light emitting layer, part of the blue light emitting layer covers the blocking layer, and the blocking layer is a hole blocking layer.

A preparation method of an organic electroluminescent device having a pixel arrangement with a shared blue light emitting layer comprises the following steps:

S1, evaporation coating a first conducting layer and a second conducting layer in sequence upon a substrate by using an open mask;

S2, spattering a red light optical compensation layer with a thickness of 30-60 nm and a yellow light optical compensation layer with a thickness of 10-30 nm upon the second conducting layer by using a precision mask;

S3, evaporation coating a hole injection layer, a hole transport layer and a blue light emitting layer in sequence by using an open mask;

S4, evaporation coating an electron blocking layer and a yellow light emitting layer in sequence upon the blue light emitting layer by using a low precision mask, wherein the electron blocking layer covers part of the blue light emitting layer;

S5, evaporation coating an electron transport layer, an electron injection layer, a second electrode layer and an optical coupling layer in sequence upon the yellow light emitting layer by using an open mask.

As an alternative embodiment, the steps S3-S5 may also be as follows:

S3, evaporation coating a hole injection layer and a hole transport layer in sequence by using an open mask, and evaporation coating a yellow light emitting layer and a hole blocking layer in sequence by using a low precision mask, wherein the yellow light emitting layer covers part of the hole transport layer;

S4, evaporation coating a blue light emitting layer upon the hole blocking layer by using an open mask;

S5, evaporation coating an electron transport layer, an electron injection layer, a second electrode layer and an optical coupling layer in sequence upon the blue light emitting layer by using an open mask.

A preparation method of an organic electroluminescent device having a pixel arrangement with a shared blue light emitting layer comprises the following steps:

S1, evaporation coating a first conducting layer, a second conducting layer and a hole injection layer in sequence upon a substrate by using an open mask;

S2, spattering a red light optical compensation layer with a thickness of 30-70 nm and a yellow light optical compensation layer with a thickness of 15-45 nm upon the hole injection layer by using a precision mask;

S3, evaporation coating a hole transport layer and a blue light emitting layer in sequence by using an open mask;

S4, evaporation coating an electron blocking layer and a yellow light emitting layer in sequence upon the blue light emitting layer by using a low precision mask, wherein the electron blocking layer covers part of the blue light emitting layer;

S5, evaporation coating an electron transport layer, an electron injection layer, a second electrode layer and an optical coupling layer in sequence upon the yellow light emitting layer by using an open mask.

As an alternative embodiment, the steps S3-S5 may also be as follows:

S3, evaporation coating a hole transport layer by using an open mask, and evaporation coating a yellow light emitting layer and a hole blocking layer in sequence by using a low precision mask, wherein the yellow light emitting layer covers part of the hole transport layer;

S4, evaporation coating a blue light emitting layer upon the hole blocking layer by using an open mask;

S5, evaporation coating an electron transport layer, an electron injection layer, a second electrode layer and an optical coupling layer in sequence upon the blue light emitting layer by using an open mask.

As compared to prior art, the above-mentioned technical scheme of the present invention has the following advantages:

(1) The light emitting layer of the present invention comprises a blue light emitting layer and a yellow light emitting layer that are stacked with a blocking layer interposed between them; the cross-sectional area of the blue light emitting layer equals that of the hole transport layer or the electron transport layer, a projection of the yellow light emitting layer on the substrate is within a projection area of the blue light emitting layer on the substrate and partially covers the projection area of the blue light emitting layer. By arranging a yellow light optical compensation layer and a red light optical compensation layer beneath the yellow light emitting layer, light emitting in four colors of red, green, blue and yellow by the device is realized, wherein, for the yellow light and the red light, the thickness of ITO can be adjusted as shown in FIG. 4 and FIG. 5 to compensate the optical micro-cavity thicknesses for yellow (Y) and red (R) light, or, the thickness of hole injection layer (HIL) can be adjusted as shown in FIG. 6 and FIG. 7 to compensate the optical micro-cavity thicknesses for yellow (Y) and red (R) light. In the preparation process of the light emitting layer with this type of structure, the blue light emitting layer can be prepared together with the hole transport layer or the electron transport layer by using the same ordinary mask, the yellow light emitting layer and the blocking layer can be prepared by using a low precision mask. In comparison to that the light emitting layer of prior art needs to use three sets of precision masks, the present invention saves two sets of precision masks, reduces the number of aligning times for the precision masks, and increases the process accuracy to a certain extent. This is because the mask aligning each time would produce some deviation, less aligning times brings less deviation, thereby increasing the product yield rate and greatly reducing the cost.

(2) The present invention utilizes ITO or HIL to form a micro-cavity effect with the light emitting layer, so as to make the device emit light in four colors by adjusting the thickness of ITO or HIL. Only two sets of precision masks are needed in the preparation process to spatter a predefined thickness of ITO or HIL in areas corresponding to the red light sub-pixels or the yellow light sub-pixels, thereby realizing light emitting in four colors of RGBY. This secondary scheme uses two precision masks to achieve light emitting in four colors, which increase the aperture rate of pixels, reduces the cost and prevents visual recognition defects.

(3) The RGBY pixel arrangement of the present invention may also adopt the device structures shown in FIG. 8 and FIG. 9. When applied in a bottom-emitting device with shared blue light emitting layer and yellow light emitting layer, this arrangement avoids using high precision masks and only needs to use a bar-shaped mask, thereby realizing light emitting in four colors without using precision masks. When applied in a top-emitting device with shared blue light emitting layer and yellow light emitting layer, this arrangement only needs two sets of low precision masks to realize light emitting in four colors. Therefore, this arrangement avoids using high precision masks, increases the aperture rate of pixels and raises PPI. As compared to conventional arrangements, a combination of this arrangement and correspondingly designed device structure can double the pixel resolution PPI up to 600 PPI. Besides, the RGBY pixels can widen the color coverage scope of the display panel, diversify the covered colors, and prevent visual defects.

BRIEF DESCRIPTION OF THE DRAWINGS

In order to make the content of the present invention more easy to be understood clearly, hereinafter, the present invention is further described in detail according to specific embodiments of the present invention with reference to the accompanying drawings, wherein.

Wherein: 1—first conducting layer, 2—second conducting layer, 21—ITO yellow light optical compensation layer, 22—ITO red light optical compensation layer, 5—hole injection layer, 51—HIL yellow light optical compensation layer, 52—HIL red light optical compensation layer, 6—hole transport layer, 7—blue light emitting layer, 8—electron blocking layer, 9—yellow light emitting layer, 10—electron transport layer, 11—electron injection layer, 12—second electrode layer, 13—optical coupling layer, 14—hole blocking layer.

DETAILED DESCRIPTION OF EMBODIMENTS

In order to make the objective, technical scheme and advantages of the present invention more clear, hereinafter, detailed description of embodiments of the present invention is given below, with reference to the accompanying drawings.

The present invention can be implemented in many different forms, and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is defined by the Claims. In the accompanying drawings, for the sake of clarity, dimensions and relative sizes of layers and areas might be exaggerated. It should be understood that, when one element such as a layer, an area or a substrate plate is described as "formed on" or "configured on" another element, this one element may be configured directly upon that another element, or there may exist intermediate element(s). On the contrary, when one element is described as "directly formed upon" or "directly configured upon" another element, there exist no intermediate element.

Embodiment 1

Figure 1:
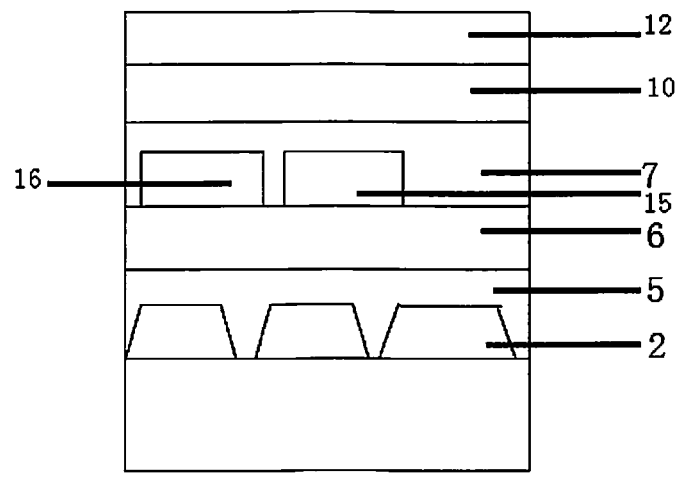
FIG. 1 is a structural schematic diagram of a light emitting device in prior art.
Figure 2:
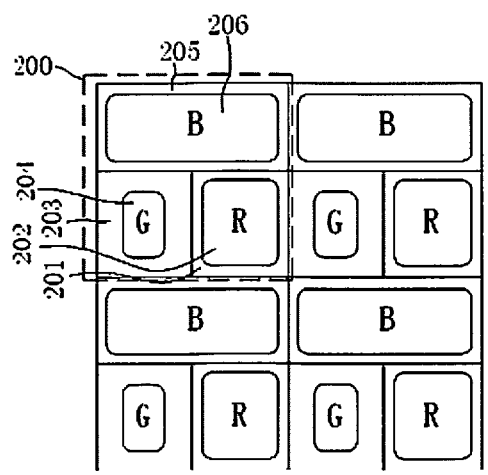
FIG. 2 is a schematic diagram of a pixel arrangement in prior art.
Figure 3:
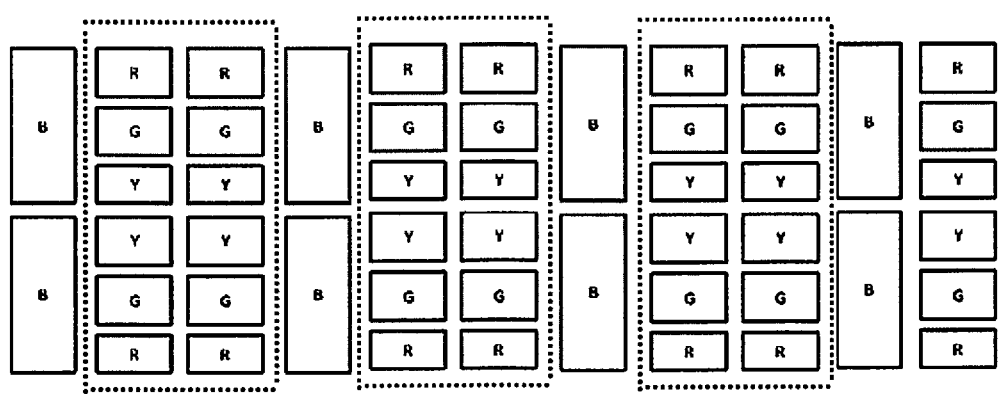
FIG. 3 is schematic diagram of a pixel arrangement according to the present invention.

As shown in FIG. 3, a pixel arrangement with a shared blue light emitting layer comprises m rows and n columns of first pixel units, wherein, the first pixel units are blue light sub-pixels, m is a non-zero natural number, n is a natural number larger than or equal to 2, two columns of second pixel units are arranged between neighboring first pixel units, each of the second pixel units comprises a red light sub-pixel, and a green light sub-pixel and a yellow light sub-pixel that are arranged in a juxtaposed manner. Every dotted line block in FIG. 3 includes two rows and two columns of second pixel units.

The red light sub-pixel, the green light sub-pixel and the yellow light sub-pixel in the second pixel unit have completely or partially overlapping projections in a row direction.

The red light sub-pixel, the green light sub-pixel and the yellow light sub-pixel in the second pixel unit have no overlapping projection on the blue light sub-pixel. Every two neighboring rows of the second pixel units are arranged to mirror each other, for example, a second pixel unit in the first row includes a red light sub-pixel, a green light sub-pixel and a yellow light sub-pixel from upside to downside, while the corresponding second pixel unit in the second row includes a yellow light sub-pixel, a green light sub-pixel and a red light sub-pixel from upside to downside. By means of such pixel arrangement with a shared blue light emitting layer with the second pixel units in two neighboring rows arranged to mirror each other, the original arrangement including three sub-pixels can be expanded to include 12 sub-pixels, thereby increasing the pixel resolution PPI.

Embodiment 2

Figure 4:
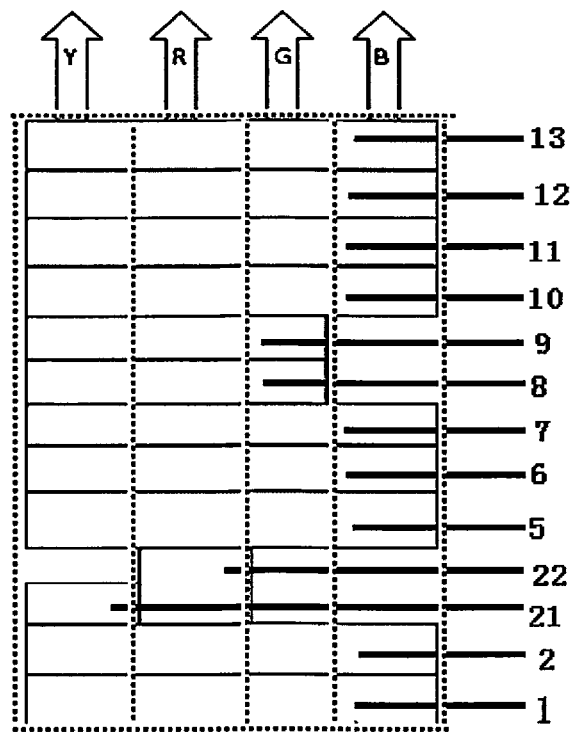
FIG. 4 is a structural schematic diagram of a first embodiment of an organic electroluminescent device according to the present invention.

As shown in FIG. 4, this embodiment provides an organic electroluminescent device having the pixel arrangement according to Embodiment 1, comprising a substrate (not shown), with a first electrode layer, a plurality of light emitting unit layers and a second electrode layer 12 formed in sequence on the substrate, as well as an optical coupling layer 13 upon the second electrode layer 12, wherein the first electrode layer comprises a first conducting layer 1 and a second conducting layer 2 arranged in sequence upon the substrate, and the light emitting unit layers comprise a hole injection layer 5, a hole transport layer 6, a light emitting layer, an electron transport layer 10 and an electron injection layer 11 arranged in sequence upon second conducting layer 2.

The light emitting layer comprises a blue light emitting layer 7 and a yellow light emitting layer 9 that are stacked with a blocking layer interposed between them. The blue light emitting layer 7 covers the hole transport layer 6, the blocking layer covers part of the blue light emitting layer 7, the yellow light emitting layer 9 covers the blocking layer, and the blocking layer is an electron blocking layer 8. A projection of the yellow light emitting layer 9 on the substrate is within a projection area of the blue light emitting layer 7 on the substrate and partially covers the projection area of the blue light emitting layer 7.

The organic electroluminescent device further comprises an optical compensation layer arranged next to the hole injection layer 5. The optical compensation layer in this embodiment is interposed between the second conducting layer 2 and the hole injection layer 5. The optical compensation layer comprises an ITO yellow light optical compensation layer 21 and an ITO red light optical compensation layer 22 that are arranged side by side, wherein the ITO yellow light optical compensation layer 21 has a thickness less than that of the ITO red light optical compensation layer 22.

The light emitting layer in this embodiment is composed of a blue light emitting layer 7 and a yellow light emitting layer 9. Herein, the blue light optical micro-cavity is taken as a benchmark; the optical length of green light is compensated by the total thickness of the electron blocking layer (EBL) 8 and the blue light emitting layer in the light emitting layer, said total thickness of the two is 20-50 nm, preferably 40 nm; the optical lengths of yellow light and red light are further compensated by micro-cavity through the thickness of ITO, in addition to the basic compensation like that of green light, wherein the ITO yellow light optical compensation layer 21 has a thickness of 10-30 nm, preferably 20 nm, and the ITO red light optical compensation layer 22 has a thickness of 30-60 nm, preferably 45 nm. Hence, in the evaporation coating process of the organic layers, the use of precision masks is avoided; because the mask used for spattering the ITO has higher accuracy than the mask used for evaporation coating the organic layers, the PPI can be increased.

A projection of the optical compensation layer on the substrate is within the projection area of the yellow light emitting layer 9 on the substrate and partially covers the projection area of the yellow light emitting layer 9. The optical compensation layer covers part of the first electrode layer and has a projection on the substrate within a projection area of the yellow light emitting layer 9 on the substrate. The optical compensation layer is made of the same material as the second conducting layer 2.

The host material of the blue light emitting layer 7 is a hole type host material, such as NPB or TCTA.

The first conducting layer is Ag, the second conducting layer is ITO, and the second electrode layer is Ag.

In FIG. 4, the area that corresponds to the ITO yellow light optical compensation layer 21, namely, the area within the leftmost dotted line block in FIG. 4, serves as a yellow sub-pixel; the area that corresponds to the ITO red light optical compensation layer 22, namely, the area within the second dotted line block counted from the left in FIG. 4, serves as a red sub-pixel; the area where the yellow and blue light emitting layers overlap each other without overlapping the ITO yellow light optical compensation layer 21 or the ITO red light optical compensation layer 22, namely, the area within the third dotted line block counted from the left in FIG. 4, serves as a green sub-pixel; the area where the yellow and blue light emitting layers do not overlap with each other, namely, the area within the rightmost dotted line block in FIG. 4, serves as a blue sub-pixel.

The preparation method of an organic electroluminescent device having a pixel arrangement with a shared blue light emitting layer according to this embodiment comprises the following steps:
S1, evaporation coating a first conducting layer 1 and a second conducting layer 2 in sequence upon a substrate by using an open mask;
S2, spattering a red light optical compensation layer with a thickness of 30-60 nm and a yellow light optical compensation layer with a thickness of 10-30 nm upon the second conducting layer 2 by using a precision mask;
S3, evaporation coating a hole injection layer 5, a hole transport layer 6 and a blue light emitting layer 7 in sequence by using an open mask;
S4, evaporation coating an electron blocking layer 8 and a yellow light emitting layer 9 in sequence upon the blue light emitting layer 7 by using a low precision mask, wherein the electron blocking layer 8 covers part of the blue light emitting layer 7;
S5, evaporation coating an electron transport layer 10, an electron injection layer 11, a second electrode layer 12 and an optical coupling layer 13 in sequence upon the yellow light emitting layer 9 by using an open mask.

Embodiment 3

Figure 5:
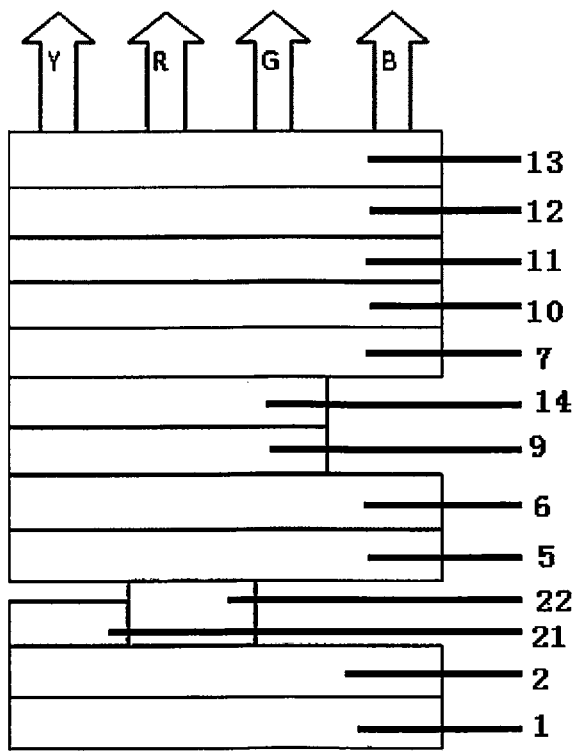
FIG. 5 is a structural schematic diagram of a second embodiment of an organic electroluminescent device according to the present invention.

As shown in FIG. 5, in this embodiment, the organic electroluminescent device having a pixel arrangement with a shared blue light emitting layer has similar structure as that of Embodiment 2, except that the positions of the blue light emitting layer 7 and the yellow light emitting layer 9 within the light emitting layer are switched, and that the blocking layer adopts a hole blocking layer 14. That is, the yellow light emitting layer 9 covers part of the hole transport layer 6, the blocking layer covers the yellow light emitting layer 9, part of the blue light emitting layer 7 covers the blocking layer, and the blocking layer is a hole blocking layer 14.

The preparation method of an organic electroluminescent device having a pixel arrangement with a shared blue light emitting layer according to this embodiment comprises the following steps:
S1, evaporation coating a first conducting layer 1 and a second conducting layer 2 in sequence upon a substrate by using an open mask;
S2, spattering a red light optical compensation layer with a thickness of 30-60 nm and a yellow light optical compensation layer with a thickness of 10-30 nm upon the second conducting layer 2 by using a precision mask;
S3, evaporation coating a hole injection layer 5 and a hole transport layer 6 in sequence by using an open mask, and evaporation coating a yellow light emitting layer 9 and a hole blocking layer 14 in sequence by using a low precision mask, wherein the yellow light emitting layer 9 covers part of the hole transport layer 6;
S4, evaporation coating a blue light emitting layer 7 upon the hole blocking layer 14 by using an open mask;
S5, evaporation coating an electron transport layer 10, an electron injection layer 11, a second electrode layer 12 and an optical coupling layer 13 in sequence upon the blue light emitting layer 7 by using an open mask.

Embodiment 4

Figure 6:
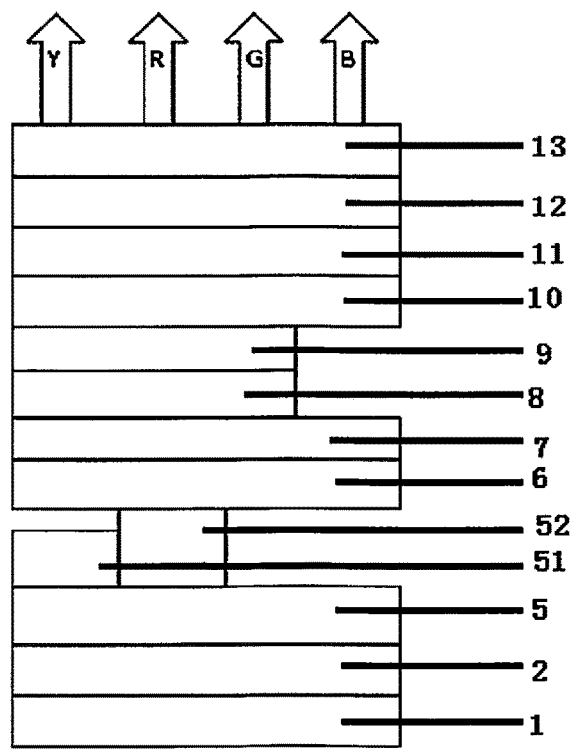
FIG. 6 is a structural schematic diagram of a third embodiment of an organic electroluminescent device according to the present invention.

As shown in FIG. 6, in this embodiment, the organic electroluminescent device having a pixel arrangement with a shared blue light emitting layer has similar structure as that of Embodiment 2, except that the optical compensation layer in this embodiment is interposed between the hole injection layer 5 and the hole transport layer 6, and the optical compensation layer covers part of the hole injection layer 5 and has a projection on the substrate within a projection area of the yellow light emitting layer 9 on the substrate. The optical compensation layer is made of the same material as the hole injection layer 5. The optical compensation layer comprises an HIL yellow light optical compensation layer 51 and an HIL red light optical compensation layer 52 that are arranged side by side, wherein, the HIL yellow light optical compensation layer 51 has a thickness less than that of the HIL red light optical compensation layer 52.

The host material of the blue light emitting layer is a compound having a structure selected from the following structural formulas (3) to (11):

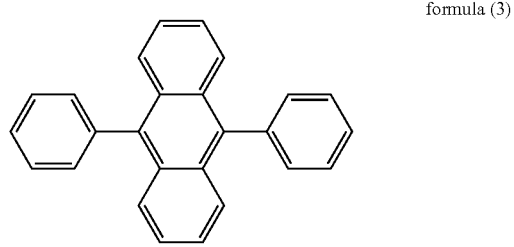

formula (3)

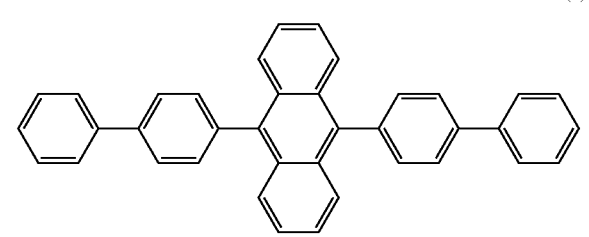

formula (4)

formula (5)

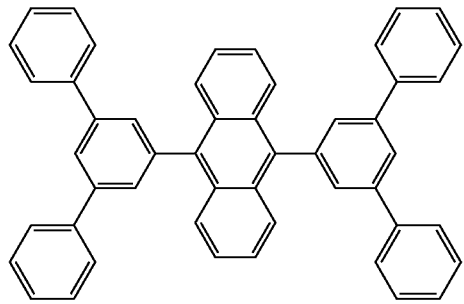

formula (6)

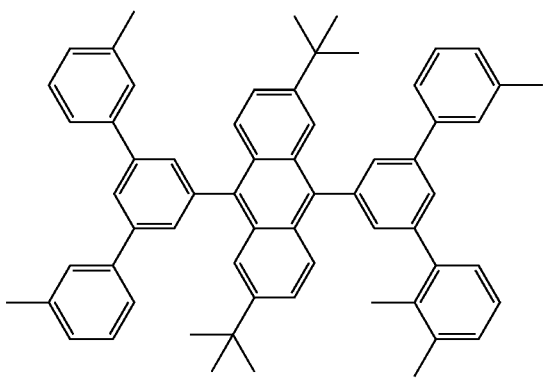

formula (7)

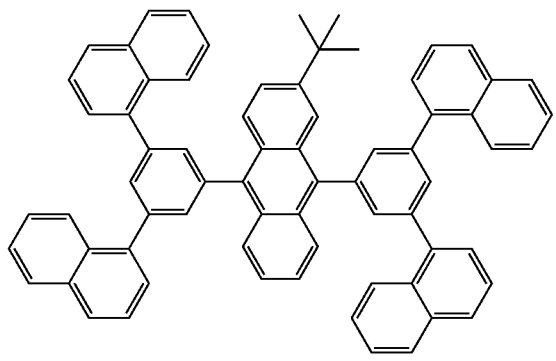

formula (8)

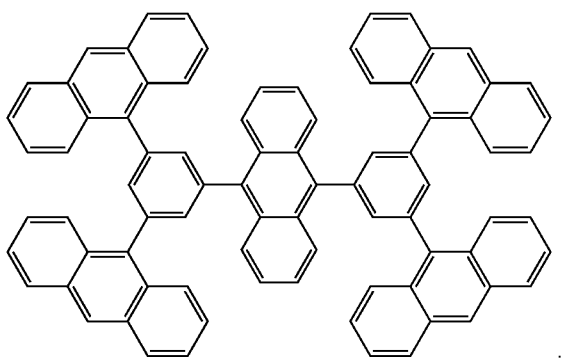

formula (9)

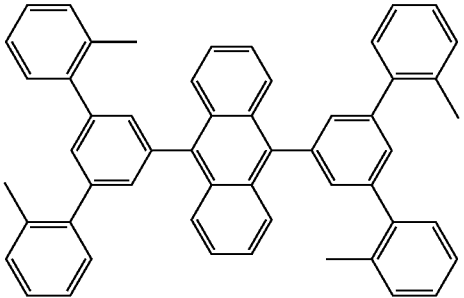

formula (10)

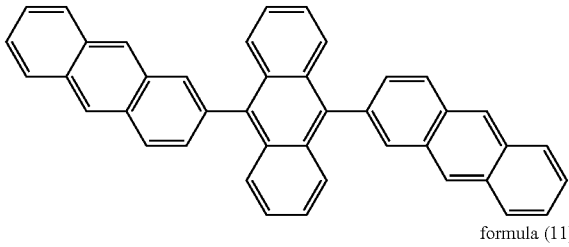

formula (11)

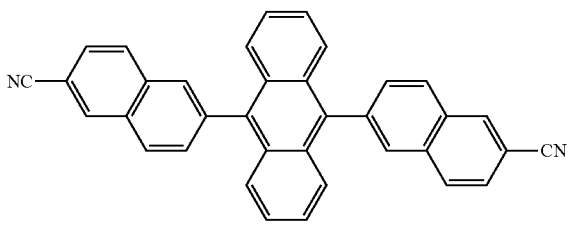

The preparation method of an organic electroluminescent device having a pixel arrangement with a shared blue light emitting layer according to this embodiment comprises the following steps:

S1, evaporation coating a first conducting layer 1, a second conducting layer 2 and a hole injection layer 5 in sequence upon a substrate by using an open mask;

S2, spattering a red light optical compensation layer with a thickness of 30-70 nm and a yellow light optical compensation layer with a thickness of 15-45 nm upon the hole injection layer 5 by using a precision mask;

S3, evaporation coating a hole transport layer 6 and a blue light emitting layer 7 in sequence by using an open mask;

S4, evaporation coating an electron blocking layer 8 and a yellow light emitting layer 9 in sequence upon the blue light emitting layer 7 by using a low precision mask, wherein the electron blocking layer 8 covers part of the blue light emitting layer 7;

S5, evaporation coating an electron transport layer 10, an electron injection layer 11, a second electrode layer 12 and an optical coupling layer 13 in sequence upon the yellow light emitting layer 9 by using an open mask.

Embodiment 5

Figure 7:
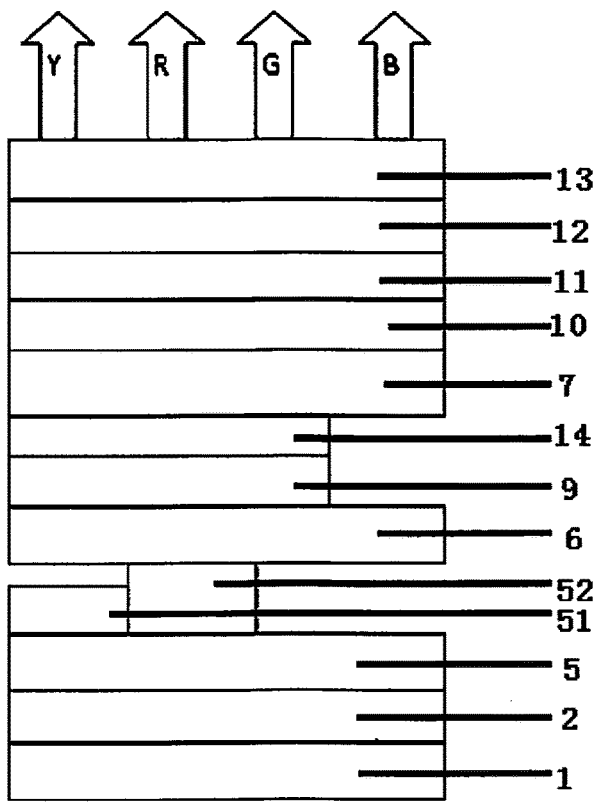
FIG. 7 is a structural schematic diagram of a fourth embodiment of an organic electroluminescent device according to the present invention.

As shown in FIG. 7, in this embodiment, the organic electroluminescent device having a pixel arrangement with a shared blue light emitting layer has similar structure as that of Embodiment 3, except that the optical compensation layer in this embodiment is interposed between the hole injection layer 5 and the hole transport layer 6, and the optical compensation layer covers part of the hole injection layer 5 and has a projection on the substrate within a projection area of the yellow light emitting layer 9 on the substrate. The optical compensation layer is made of the same material as the hole injection layer 5. The optical compensation layer comprises an HIL yellow light optical compensation layer 51 and an HIL red light optical compensation layer 52 that are arranged side by side, wherein the HIL yellow light optical compensation layer 51 has a thickness less than that of the HIL red light optical compensation layer 52.

The preparation method of an organic electroluminescent device having a pixel arrangement with a shared blue light emitting layer according to this embodiment comprises the following steps:

S1, evaporation coating a first conducting layer 1, a second conducting layer 2 and a hole injection layer 5 in sequence upon a substrate by using an open mask;

S2, spattering a red light optical compensation layer with a thickness of 30-70 nm and a yellow light optical compensation layer with a thickness of 15-45 nm upon the hole injection layer 5 by using a precision mask;

S3, evaporation coating a hole transport layer 6 by using an open mask, and evaporation coating a yellow light emitting layer 9 and a hole blocking layer 14 in sequence by using a low precision mask, wherein the yellow light emitting layer 9 covers part of the hole transport layer 6;

S4, evaporation coating a blue light emitting layer 7 upon the hole blocking layer 14 by using an open mask;

S5, evaporation coating an electron transport layer 10, an electron injection layer 11, a second electrode layer 12 and an optical coupling layer 13 in sequence upon the blue light emitting layer 7 by using an open mask.

Embodiment 6

Figure 8:
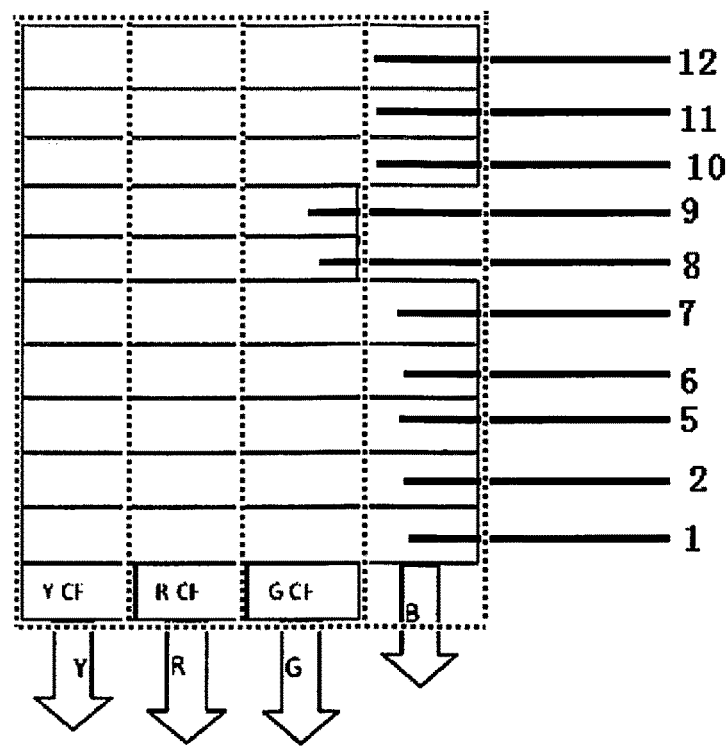
FIG. 8 is a structural schematic diagram of a fifth embodiment of an organic electroluminescent device according to the present invention.
Figure 9:
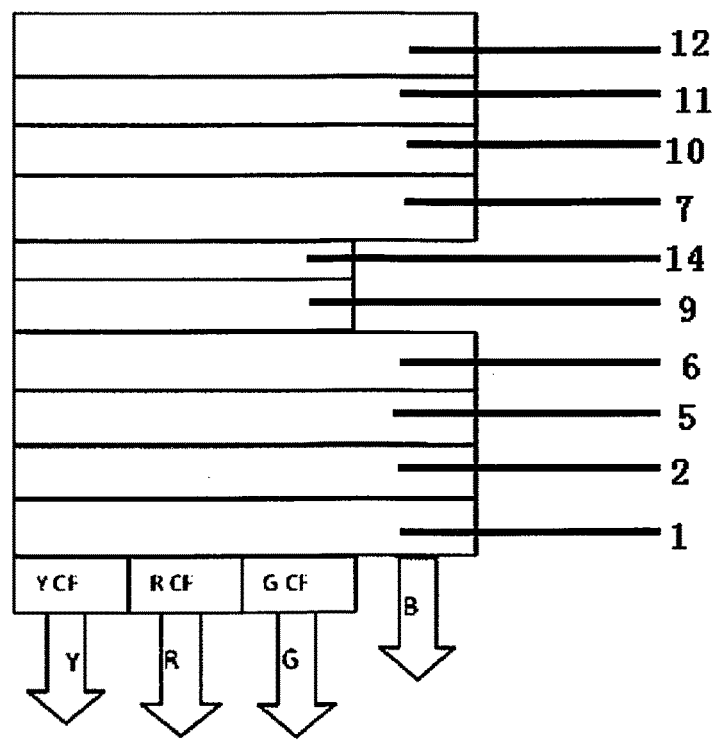
FIG. 9 is a structural schematic diagram of a sixth embodiment of an organic electroluminescent device according to the present invention.

As shown in FIG. 8, in this embodiment, the organic electroluminescent device having a pixel arrangement with a shared blue light emitting layer has similar structure as that of Embodiment 2, except that no optical compensation layer like that of Embodiment 2 is provided, and that the organic electroluminescent device further comprises a colored optical filter layer arranged beneath the first electrode layer, wherein a projection of the colored optical filter layer on the substrate overlaps the projection area of the yellow light emitting layer 9 on the substrate, and the colored optical filter layer comprises a red light optical filter, a green light optical filter and a yellow light optical filter.

In FIG. 8, the area that corresponds to the yellow light optical filter, namely, the area within the leftmost dotted line block in FIG. 8, serves as a yellow sub-pixel; the area that corresponds to the red light optical filter, namely, the area within the second dotted line block counted from the left in FIG. 8, serves as a red sub-pixel; the area that corresponds to the green light optical filter, namely, the area within the third dotted line block counted from the left in FIG. 8, serves as a green sub-pixel; the area without any optical filters, namely, the area within the rightmost dotted line block in FIG. 8, serves as a blue sub-pixel.

The preparation method of an organic electroluminescent device having a pixel arrangement with a shared blue light emitting layer according to this embodiment comprises the following steps:

S1, coating a layer of color filter (CF) on a substrate, and photo-etching to form patterns of red light CF, yellow light CF and green light CF;

S2, evaporation coating a first conducting layer 1 and a second conducting layer 2 in sequence upon the substrate by using an open mask;

S3, evaporation coating a hole injection layer 5, a hole transport layer 6 and a blue light emitting layer 7 in sequence by using an open mask;

S4, evaporation coating an electron blocking layer 8 and a yellow light emitting layer 9 in sequence upon the blue light emitting layer 7 by using a low precision mask, wherein the electron blocking layer 8 covers part of the blue light emitting layer 7;

S5, evaporation coating an electron transport layer 10, an electron injection layer 11 and a second electrode layer 12 in sequence upon the yellow light emitting layer 9 by using an open mask.

Embodiment 7

As shown in FIG. 8, in this embodiment, the organic electroluminescent device having a pixel arrangement with a shared blue light emitting layer has similar structure as that of Embodiment 3, except that no optical compensation layer like that of Embodiment 3 is provided, and that the organic electroluminescent device further comprises a colored optical filter layer arranged beneath the first electrode layer, wherein a projection of the colored optical filter layer on the substrate overlaps the projection area of the yellow light emitting layer 9 on the substrate, and the colored optical filter layer comprises a red light optical filter, a green light optical filter and a yellow light optical filter.

The preparation method of an organic electroluminescent device having a pixel arrangement with a shared blue light emitting layer according to this embodiment comprises the following steps:

S1, coating a layer of color filter (CF) on a substrate, and photo-etching to form patterns of red light CF, yellow light CF and green light CF;

S2, evaporation coating a first conducting layer 1 and a second conducting layer 2 in sequence upon the substrate by using an open mask;

S3, evaporation coating a hole injection layer 5 and a hole transport layer 6 in sequence by using an open mask;

S4, evaporation coating a yellow light emitting layer 9 and a hole blocking layer 14 in sequence upon the hole transport layer 6 by using a low precision mask, wherein the hole blocking layer 14 covers the yellow light emitting layer 9;

S5, evaporation coating a blue light emitting layer 7, an electron transport layer 10, an electron injection layer 11 and a second electrode layer 12 in sequence upon the hole blocking layer 14 by using an open mask.

The first conducting layer 1 of the first electrode layer (anode layer) can adopt an inorganic material or an organic conducting polymer. The inorganic material is usually a metal oxide such as indium tin oxide, zinc oxide, indium zinc oxide, or a metal with high work function such as gold, copper, silver, preferably, it is indium tin oxide (ITO). The organic conducting polymer is preferably selected from Polythiophene/Polyethylene based sodium benzene sulfonate (hereinafter abbreviated as PEDOT:PSS) and Polyaniline (hereinafter abbreviated as PANI). The second conducting layer 2 is made of a material selected from gold, copper or silver The second electrode layer 12 (cathode layer) usually adopts metal, metal compound or alloy with low work function such as silver, lithium, magnesium, calcium, strontium, aluminum, indium. In the present invention, the electron transport layer is preferably doped with an active metal such as Li, K, Cs which is preferably prepared by evaporation coating of an alkali metal compound.

The optical coupling layer 13 is a part of an ordinary OLED and has an effect for increasing the light extraction, with a thickness normally of 50-80 nm. It normally adopts an organic material with a high refractive index and a low absorption factor such as 2,9-dimethyl-4,7-diphenyl-1,10-phenanthroline or Alq$_3$, or adopts a dielectric with a high refractive index such as ZnS, but is not limited to these materials.

The hole injection layer 5 (HIL) has a matrix material that is preferably HAT, 4,4-(N-3-methyl-phenyl-N-phenyl-amino)-triphenylamine (m-MTDATA), 4,4TDAT, or tri-(N-2-naphthyl-N-phenyl-amino)-triphenylamine (2-TNATA).

The hole transport layer 6 (HTL) has a matrix material that may adopt a low molecular material of the arylamine type or of the branched polymer species, preferably N,N-di-(1-naphthyl)-N,N-diphenyl-1,1'-biphenyl-4,4'-diamine (NPB).

The electron transport layer 10 is selected from Alq$_3$, CBP, Bphen, BAlq or selected from the following materials:

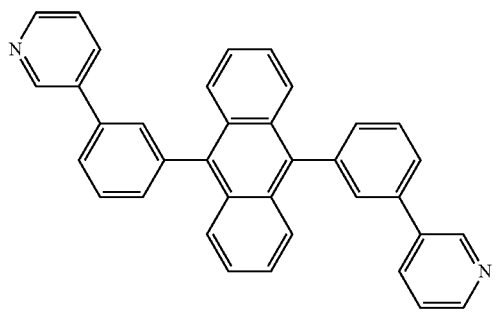

ETL-1

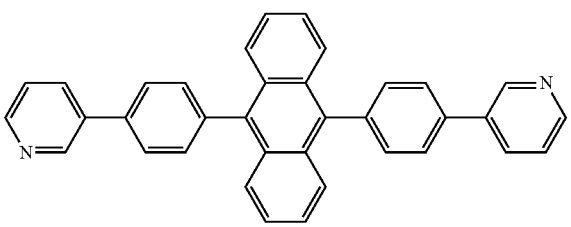

ETL-2

The structural formulas of the main chemical substances in the present invention are explained as follows:

| Abbreviation | Structural Formula |
|---|---|
| NPB | 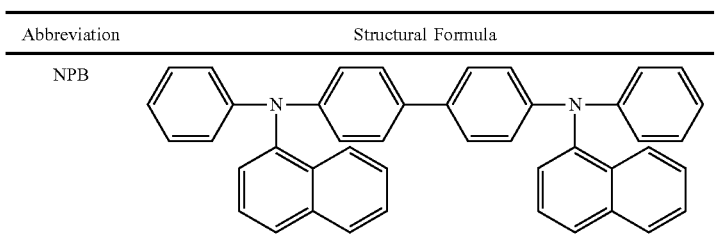 |
| HAT | 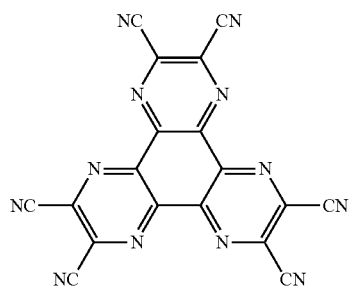 [SMILES: N#Cc1nc2c3nc(C#N)c(C#N)nc3c3nc(C#N)c(C#N)nc3c2nc1C#N] |

-continued

| Abbreviation | Structural Formula |
|---|---|
| MTDATA | |
| Ir(ppy)₃ | |
| Ir(mdq)₂(acac) | |
| ADN | |

| Abbreviation | Structural Formula |
| --- | --- |
| Alq₃ | (structure of tris(8-hydroxyquinoline) aluminum) |
| BPhen | (structure of 4,7-diphenyl-1,10-phenanthroline) |

Apparently, the aforementioned embodiments are merely examples illustrated for clearly describing the present invention, rather than limiting the implementation ways thereof. For those skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

What is claimed is:

1. A pixel arrangement with a shared blue light emitting layer, comprising m rows and n columns of first pixel units, wherein the first pixel units are blue light sub-pixels, m is a non-zero natural number, n is a natural number larger than or equal to 2, and wherein;
   two columns of second pixel units are arranged between every two neighboring columns of first pixel units, so that the pixel arrangement has a minimum repetition group consisting of one column of first pixel units and two columns of second pixel units in the row direction;
   each of the second pixel units comprises a red light sub-pixel, a green light sub-pixel and a yellow light sub-pixel that are arranged in a juxtaposed manner, and every two neighboring rows of the second pixel units are arranged to mirror each other.

2. The pixel arrangement with a shared blue light emitting layer in accordance with claim 1, wherein the red light sub-pixel, the green light sub-pixel and the yellow light sub-pixel in the second pixel unit have completely or partially overlapping projections in a row direction.

3. The pixel arrangement with a shared blue light emitting layer in accordance with claim 2, wherein the red light sub-pixel, the green light sub-pixel and the yellow light sub-pixel in the second pixel unit have no overlapping projection on the blue light sub-pixel.

4. An organic electroluminescent device having the pixel arrangement of claim 1, comprising a substrate, with a first electrode layer, a plurality of light emitting unit layers and a second electrode layer formed in sequence on the substrate, wherein the light emitting unit layers comprise a hole injection layer, a hole transport layer, a light emitting layer, an electron transport layer and an electron injection layer arranged in sequence upon the first electrode layer, wherein:
   the light emitting layer comprises a blue light emitting layer and a yellow light emitting layer that are stacked with a blocking layer interposed between them; the blue light emitting layer is in physical contact with the hole transport layer or with the electron transport layer, a projection of the yellow light emitting layer on the substrate is within a projection area of the blue light emitting layer on the substrate and partially covers the projection area of the blue light emitting layer;
   the organic electroluminescent device further comprises an optical compensation layer arranged next to the hole injection layer, a projection of the optical compensation layer on the substrate is within the projection area of the yellow light emitting layer on the substrate and partially covers the projection area of the yellow light emitting layer; and
   the optical compensation layer comprises a yellow light optical compensation layer and a red light optical compensation layer that are arranged side by side, and the yellow light optical compensation layer has a thickness less than that of the red light optical compensation layer.

5. The organic electroluminescent device in accordance with claim 4, wherein the blue light emitting layer covers the hole transport layer, the blocking layer covers part of the blue light emitting layer, the yellow light emitting layer covers the blocking layer, and the blocking layer is an electron blocking layer.

6. The organic electroluminescent device in accordance with claim 5, wherein the optical compensation layer is interposed between the first electrode layer and the hole injection layer, the optical compensation layer covers part of the first electrode layer and has a projection on the substrate within a projection area of the yellow light emitting layer on the substrate.

7. The organic electroluminescent device in accordance with claim 6, wherein the first electrode layer comprises a first conducting layer and a second conducting layer that are stacked, and the optical compensation layer is made of the same material as the second conducting layer.

8. The organic electroluminescent device in accordance with claim 5, wherein the optical compensation layer is interposed between the hole injection layer and the hole transport layer, the optical compensation layer covers part of the hole injection layer and has a projection on the substrate within a projection area of the yellow light emitting layer on the substrate.

9. The organic electroluminescent device in accordance with claim 8, wherein the optical compensation layer is made of the same material as the hole injection layer.

10. The organic electroluminescent device in accordance with claim 4, wherein the yellow light emitting layer covers part of the hole transport layer, the blocking layer covers the yellow light emitting layer, part of the blue light emitting layer covers the blocking layer, and the blocking layer is a hole blocking layer.

11. The organic electroluminescent device in accordance with claim 10, wherein the optical compensation layer is interposed between the hole injection layer and the hole transport layer, the optical compensation layer covers part of the hole injection layer and has a projection on the substrate within a projection area of the yellow light emitting layer on the substrate.

12. The organic electroluminescent device in accordance with claim 4, wherein the blue light emitting layer and the blocking layer has a total thickness of 20-50 nm, the yellow light optical compensation layer has a thickness of 10-30 nm, and the red light optical compensation layer has a thickness of 30-60 nm.

13. An organic electroluminescent device having the pixel arrangement of claim 1, comprising a substrate, with a first electrode layer, a plurality of light emitting unit layers and a second electrode layer formed in sequence on the substrate, wherein the light emitting unit layers comprise a hole injection layer, a hole transport layer (6), a light emitting layer, an electron transport layer and an electron injection layer arranged in sequence upon the first electrode layer, wherein:
the light emitting layer comprises a blue light emitting layer and a yellow light emitting layer that are stacked with a blocking layer interposed between them; the blue light emitting layer is in physical contact with the hole transport layer (6) or with the electron transport layer (10), a projection of the yellow light emitting layer on the substrate is within a projection area of the blue light emitting layer on the substrate and partially covers the projection area of the blue light emitting layer;
the organic electroluminescent device further comprises a colored optical filter layer arranged beneath the first electrode layer, a projection of the colored optical filter layer on the substrate overlaps the projection area of the yellow light emitting layer on the substrate, and the colored optical filter layer comprises a red light optical filter, a green light optical filter and a yellow light optical filter.

14. The organic electroluminescent device in accordance with claim 13, wherein the blue light emitting layer covers the hole transport layer (6), the blocking layer covers part of the blue light emitting layer, the yellow light emitting layer covers the blocking layer, and the blocking layer is an electron blocking layer.

15. The organic electroluminescent device in accordance with claim 13, wherein the yellow light emitting layer covers part of the hole transport layer, the blocking layer covers the yellow light emitting layer, part of the blue light emitting layer covers the blocking layer, and the blocking layer is a hole blocking layer (14).

16. The organic electroluminescent device in accordance with claim 10, wherein the optical compensation layer is interposed between the first electrode layer and the hole injection layer, the optical compensation layer covers part of the first electrode layer and has a projection on the substrate within a projection area of the yellow light emitting layer on the substrate.

* * * * *